US010922451B2

(12) United States Patent
Lee et al.

(10) Patent No.: US 10,922,451 B2
(45) Date of Patent: Feb. 16, 2021

(54) ENSEMBLE-BASED RESERVOIR CHARACTERIZATION METHOD USING MULTIPLE KALMAN GAINS AND DYNAMIC DATA SELECTION

(71) Applicant: Korea Institute Of Geoscience And Mineral Resources, Daejeon (KR)

(72) Inventors: Kyung Book Lee, Daejeon (KR); Jong Geun Choe, Seoul (KR); Won Suk Lee, Daejeon (KR); Hyun Suk Lee, Daejeon (KR); Tae Woong Ahn, Sejong (KR); Tae Hun Lee, Sejong (KR)

(73) Assignee: KOREA INSTITUTE OF GEOSCIENCE AND MINERAL RESOURCES, Daejeon (KR)

( * ) Notice: Subject to any disclaimer, the term of this patent is extended or adjusted under 35 U.S.C. 154(b) by 429 days.

(21) Appl. No.: 15/749,564

(22) PCT Filed: Mar. 6, 2017

(86) PCT No.: PCT/KR2017/002404
§ 371 (c)(1),
(2) Date: Feb. 1, 2018

(87) PCT Pub. No.: WO2017/179818
PCT Pub. Date: Oct. 19, 2017

(65) Prior Publication Data
US 2018/0225396 A1 Aug. 9, 2018

(30) Foreign Application Priority Data
Apr. 14, 2016 (KR) .................. 10-2016-0045410

(51) Int. Cl.
*G06F 17/16* (2006.01)
*G01V 99/00* (2009.01)
(Continued)

(52) U.S. Cl.
CPC .............. *G06F 30/20* (2020.01); *E21B 43/00* (2013.01); *G06F 17/16* (2013.01); *G06K 9/6223* (2013.01);
(Continued)

(58) Field of Classification Search
CPC .......... G06F 30/20; G06F 17/16; E21B 43/00; G06K 9/6223; G01V 99/005; G01V 2210/665; G01V 2210/663
(Continued)

(56) References Cited

U.S. PATENT DOCUMENTS

| 7,584,081 B2 * | 9/2009 | Wen ....................... E21B 43/00 703/2 |
| 2011/0218737 A1 | 9/2011 | Gulati |
| 2013/0338983 A1 | 12/2013 | Sarma et al. |

OTHER PUBLICATIONS

Kim et al., "Characterization of channelized gas reservoirs using ensemble Kalman filter with application of discrete cosine transformation", Mar. 7, 2016, Energy Exploration & Exploitation 34.2, pp. 319-336.*

(Continued)

*Primary Examiner* — Juan C Ochoa
(74) *Attorney, Agent, or Firm* — Harness, Dickey & Pierce, P.L.C.

(57) ABSTRACT

The present disclosure relates to an ensemble-based reservoir characterization method using multiple Kalman gains and dynamic data selection. The method includes preparing available data; generating initial ensembles by using the prepared static data; clustering and separating the generated initial models on the basis of a distance-based method; selecting the dynamic data; dynamically simulating the selected dynamic data by using the generated ensembles; calculating multiple Kalman gains by using initial models clustered in the same group as the selected dynamic data; updating ensemble members by means of the selected (Continued)

dynamic data and the multiple Kalman gains; and predicting a movement of a reservoir by using the updated models, and evaluating uncertainty thereof. Therefore, multiple Kalman gains are calculated and a final model is obtained using the selected dynamic data, and a reliable uncertainty evaluation and a future movement prediction can be performed within a short time by using the final model.

6 Claims, 17 Drawing Sheets

(51) Int. Cl.
 G06F 30/20 (2020.01)
 E21B 43/00 (2006.01)
 G06K 9/62 (2006.01)
(52) U.S. Cl.
 CPC ...... *G01V 99/005* (2013.01); *G01V 2210/663* (2013.01); *G01V 2210/665* (2013.01)

(58) Field of Classification Search
 USPC .................................................. 703/10, 2
 See application file for complete search history.

(56) References Cited

OTHER PUBLICATIONS

Lee et al., "Characterization of channelized reservoir using ensemble Kalman filter with clustered covariance", 2013, Energy exploration & exploitation 31.1, pp. 17-29.*
Lee et al., "Uncertainty quantification of channelized reservoir using ensemble smoother with selective measurement data", 2014, Energy Exploration & Exploitation 32.5, pp. 805-816.*
Lee Chung-Ho, Characterization of Channelized Gas Reservoirs with an Aquifer Using EnKF and DCT, Feb. 2016, Engineering Master's Thesis, Seoul National University Graduate School, 57 pages.*
International Search Report PCT/ISA/210 for International Application No. PCT/KR2017/002404 dated Jun. 19, 2017.

* cited by examiner

◨ The reference field

☐ Initial model

☒ Result of ES

☐ Result of ES with multiple Kalman gains

☒ The reference field

☐ Initial model

☐ Result of ES with selective dynamic data

☐ Result of ES with multiple Kalman gains and selective dynamic data

ENSEMBLE-BASED RESERVOIR CHARACTERIZATION METHOD USING MULTIPLE KALMAN GAINS AND DYNAMIC DATA SELECTION

CROSS-REFERENCE TO RELATED APPLICATIONS

This application is a National Stage Application of PCT/KR2017/002404 filed on Mar. 6, 2017, which claims priority to Korean Patent Application No. 10-2016-0045410 filed on Apr. 14, 2016 the entire contents of each of which are hereby incorporated by reference.

TECHNICAL FIELD

The present disclosure relates to an ensemble-based reservoir characterization method using multiple Kalman gains and dynamic data selection. More particularly, the present disclosure relates to an ensemble-based reservoir characterization method using multiple Kalman gains and dynamic data selection to calculate multiple Kalman gains appropriate to an initial static model and to obtain a reliable final model by using selected dynamic data within a short period of time.

BACKGROUND ART

In general, the ensemble-based method is an optimization technique used in various fields such as meteorology, oceanology, petroleum engineering, and so on. Two representative examples of the ensemble-based method include the ensemble Kalman filter (EnKF) and the ensemble smoother (ES) both of which perform inverse modeling whereby static models are assimilated by using dynamic data. For instance, since static models integrating static data with geostatistics involve a large degree of uncertainty, integration of the observed dynamic data is necessary to improve initial static modeling outcomes.

The Kalman gain and the observed dynamic data are key parameters in the ensemble-based method, and inverse operation results depend largely on these two parameters. Firstly, the Kalman gain in the ensemble-based method plays a role as the sensitivity matrix in gradient-based optimization methods. As the sensitivity matrix has different values depending on the static model, the Kalman gain should be also calculated considering the static model characteristics as well. However, the standard ensemble-based method has a low accuracy of assimilation results due to the use of only one Kalman gain for all the static models, which are different from each other. To resolve the problem above, Lee et al. proposed a method in the paper (source: Lee, K., Jeong, H., S. P., and Choe, J., 2013, "Improvement of Ensemble Smoother with Clustered Covariance for Channelized Reservoirs," Energ. Explor. Exploit., 31(5), pp. 713-726.) and improved the assimilation results by using multiple Kalman gains considering the characteristics of the static model.

FIG. 1 is a flow chart illustrating a process for the performance of reservoir characterization by using a standard ES.

Referring to FIG. 1, firstly, in step S101, available data for reservoir characterization is prepared. The available data includes static and dynamic data.

In step S102, initial ensembles are generated by using the static data.

In step S103, simulation using all the dynamic data is performed by using the ensembles.

In step S104, one Kalman gain is calculated by using all the dynamic data.

In step S105, ensemble members are updated with all dynamic data and one Kalman gain.

In step S106, reservoir performances are predicted by using the updated ensemble members. The steps described above may be processes calculated by a general computing apparatus.

Secondly, the dynamic data significantly affect the assimilation results because they are not only used for Kalman gain but also for calculation of the difference from the simulation results of a static model. However, some data among the observed data are meaningless and may prevent proving consistent information for assimilation. Consequently, use of all dynamic data sometimes induces errors in the reservoir characterization and causes a problem of long calculation time. Furthermore, previous research showed that the results of EnKF for PUNQ-S3 were also sensitive for observed data.

To resolve such a problem, Park and Choe explained in a paper cited below a method for excluding low sensitivity dynamic data such as water saturation after water breakthrough (source: Park, K., and Choe, J., 2006, "Use of ensemble Kalman filter with 3-dimensional reservoir characterization during waterflooding," Paper presented at the SPE EUROPEC/EAGE Annual Conference and Exhibition, Vienna, Austria, June 12-15, Paper No. SPE 100178.). In addition, Lee et al. explained in the paper cited below a method of optional use of dynamic data such as oil production rate (OPR) before water breakthrough and water cut (WCT) thereafter (source: Lee, K., Jung, S., Shin, H., and Choe, J., 2014, "Uncertainty quantification of channelized reservoir using ensemble smoother with selective measurement data," Energ. Explor. Exploit., 32(5), pp. 805-816.).

DOCUMENTS OF RELATED ART

Non-Patent Documents (Non-Patent Document 1) Lee, K., Jeong, H., Jung, S. P., and Choe, J., 2013, "Improvement of Ensemble Smoother with Clustered Covariance for Channelized Reservoirs," Energ. Explor. Exploit., 31(5), pp. 713-726.

(Non-Patent Document 2) Park, K., and Choe, J., 2006, "Use of ensemble Kalman filter with 3-dimensional reservoir characterization during waterflooding," Paper presented at the SPE EUROPEC/EAGE Annual Conference and Exhibition, Vienna, Austria, June 12-15, Paper No. SPE 100178.

(Non-Patent Document 3) Lee, K., Jung, S., Shin, H., and Choe, J., 2014, "Uncertainty quantification of channelized reservoir using ensemble smoother with selective measurement data," Energ. Explor. Exploit., 32(5), pp. 805-816.

DISCLOSURE

Technical Problem

The purpose of the present disclosure is to improve the problems of the application time and the reliability of the ensemble-based reservoir characterization method. First, for the application time, the invented technology is applied to ES which simultaneously assimilates all dynamic data instead of EnKF which needs to perform recursive assimilation. This is to provide, in calculation for the assimilation of the ES, the ensemble-based reservoir characterization method using multiple Kalman gains which use selective dynamic data to reduce a matrix size and dynamic data selection.

In addition, the purpose of the present disclosure is to provide the ensemble-based reservoir characterization method using multiple Kalman gains and dynamic data selection to improve the assimilation accuracy. Through this, Kalman gain and observed dynamic data, key parameters used in an assimilation equation of the ensemble-based method, can be improved.

In addition, the purpose of the present disclosure is to provide the ensemble-based reservoir characterization method using multiple Kalman gains and dynamic data selection by obtaining more accurate multiple Kalman gains. In Kalman gain calculation, a clustering of similar initial models is prerequisite for a calculation of multiple Kalman gains and a distance-based method is applied therefor. Accordingly, more accurate multiple Kalman gains can be obtained by using the static-based distance directly rather than the dynamic-based distance by minimizing a time for the distance-based method.

Technical Solution

To achieve the above described purposes, an ensemble-based reservoir characterization method using multiple Kalman gains and dynamic data selection, the method includes: preparing available data comprising static and dynamic data; generating initial ensembles by using the prepared static data; clustering and separating the generated initial ensembles on the basis of a distance-based method; selecting the dynamic data; dynamically simulating the selected dynamic data by using the generated initial ensembles; calculating multiple Kalman gains by using initial models clustered in the same group as the selected dynamic data; updating ensemble members by means of the selected dynamic data and the multiple Kalman gains; and predicting a movement of a reservoir by using the updated ensemble members, and evaluating uncertainty thereof.

At the calculating multiple Kalman gains, a g-th Kalman gain is calculated by the following equation:

$$K_g = C_{Y_{s,g}}^{P} H^T (H C_{Y_{s,g}}^{P} H^T + C_D)^{-1}$$

where, g, ranging from 1 to the number of total clusters (Nc), represents the group the model belongs to, $K_g$ indicates the Kalman gain representing the group g among multiple Kalman gains, $C_{Y_{s,g}}^{P-}$ indicates the previous estimate error covariance of the group g, H and $C_D$ represent the measurement operator and observation error covariance, respectively, and $H^T$ means a transpose of the measurement operator.

At the updating the ensemble members by using an ES, a state vector y, representing the ensembles, is expressed by the following equation:

$$y_{t_i,k,g} = \begin{bmatrix} m_{t_i}^s \\ m_{t_i}^d \\ d \end{bmatrix}_{k,g}$$

where, $y_{t_i,k,g}$ represents the state vector of k-th model in the group g at an initial time, $t_i$, $m_{t_g}^s$ and $m_{t_i}^d$ represent static and dynamic parameters at the initial time, $t_i$, respectively, and d represents dynamic data prediction from initial model to be compared with observed dynamic data.

The state vector can be assimilated by using multiple Kalman gains by the following equation.

$$y_{k,g}^a = y_{k,g}^p + K_g(d_{k,g} - H y_{k,g}^p)$$

where, $y_{k,g}^a$ and $y_{k,g}^p$ mean an assimilated and previous state vectors of the k-th model in the group g, respectively, and $d_{k,g}$ represents a dynamic data prediction of the k-th model in the group g.

At the calculating the multiple Kalman gains, the Kalman gain is calculated by cluster after clustering the initial ensemble models based on the distance-based method, and Kalman gain obtained by cluster can be configured to be obtained from covariance by cluster.

The clustered covariance can be obtained by: obtaining a distance matrix; converting the distance matrix into coordinate points in the metric space; and classifying adjacent coordinate points into the same group.

The obtaining the distance matrix is performed by using a Minkowski equation for the static data, and the converting the distance matrix into coordinate points in the metric space is performed by using multidimensional scaling (MDS); and the classifying the adjacent coordinate points into the same group is performed by using K-means algorithm.

The data for obtaining the distance matrix can be configured by using logically meaningful selected dynamic data instead of static data.

Advantageous Effects

Thus, the ensemble-based reservoir characterization method using multiple Kalman gains and dynamic data selection of the present disclosure has an effect of calculating multiple Kalman gains appropriate to an initial static model, obtaining a final model by using selected dynamic data, and performing uncertainty quantification for future reservoir performances by using the final model within a short period of time.

In addition, the ensemble-based reservoir characterization method using multiple Kalman gains and dynamic data selection of the present disclosure has an effect of enhancing assimilation capability of the ensemble-based method by improving both the Kalman gain and the observed dynamic data which are key parameters used in an assimilation equation of the ensemble-based method.

In addition, the ensemble-based reservoir characterization method using multiple Kalman gains and dynamic data selection of the present disclosure is capable of saving calculation time by reducing the matrix size of the Kalman gain and improving reliability of multiple Kalman gains by using more appropriate dynamic data only, thus generating a synergy effect of using two methods (multiple Kalman gains and selected dynamic data) together.

In addition, the ensemble-based reservoir characterization method using multiple Kalman gains and dynamic data selection of the present disclosure reduces simulation time significantly due to application for ES and has an effect enabling uncertainty quantification and prediction of future performances quickly by saving inverse modeling time.

In addition, the ensemble-based reservoir characterization method using multiple Kalman gains and dynamic data selection of the present disclosure classifies the initial static models into groups by using the distance-based method to obtain multiple Kalman gains and has an effect of improving the Kalman gain since more accurate grouping within a short period of time is possible.

DESCRIPTION OF DRAWINGS

FIGS. 3a and 3b are diagrams illustrating the workflow of the ES and EnKF, respectively, with observed dynamic data (FIG. 3c) according to an embodiment of the present disclosure, wherein FIG. 3a is the ES; FIG. 3b is the EnKF.

FIGS. 6a, 6b, 6c, and 6d are diagrams illustrating horizontal permeability (static model) according to an embodiment of the present disclosure, wherein FIG. 6a illustrates the reference field regarded as a right answer; FIG. 6b illustrates an average of the initial models; FIG. 6c illustrates an average of results of the standard ES; and FIG. 6d illustrates an average of results of the ES with multiple Kalman gains.

FIGS. 8a, 8b, 8c, and 8d illustrate the histograms of horizontal permeability from the first layer of the PUNQ-S3 model according to an embodiment of the present disclosure, wherein FIG. 8a is a graph of the reference field; FIG. 8b is a graph of the initial model; FIG. 8c is a graph of the standard ES; and FIG. 8d is a graph of the ES with multiple Kalman gains.

FIGS. 9a, 9b, and 9c illustrate prediction of each reservoir performance from the updated models of the standard ES (the first row) and the ES with multiple Kalman gains (the second row) according to an embodiment of the present disclosure, wherein FIG. 9a is a graph illustrating cumulative oil production (COP); FIG. 9b is a graph illustrating cumulative gas production (CGP); and FIG. 9C is a graph illustrating cumulative water production (CWP).

FIGS. 10a, 10b, 10c, and 10d illustrate horizontal permeability of all five layers of the PUNQ-S3 model according to an embodiment of the present disclosure, wherein FIG. 10a is a diagram illustrating the reference field; FIG. 10b is a diagram illustrating averages of initial models; FIG. 10c is a diagram illustrating averages of the ES with selected dynamic data; and FIG. 10d is a diagram illustrating averages of the ES with multiple Kalman gains and selected dynamic data.

FIGS. 11a, 11b, 11c, and 11d illustrate the histograms of horizontal permeability of a PUNQ-S3 model according to an embodiment of the present disclosure, wherein FIG. 11a is a diagram of the reference field; FIG. 11b is a diagram of the initial model; FIG. 11c is a diagram of the ES with selected dynamic data; and FIG. 11d is a diagram of the ES with multiple Kalman gains and selected dynamic data.

FIGS. 12a and 12b illustrate predictions of CWP from the updated models according to an embodiment of the present disclosure, wherein FIG. 12a is a graph for the ES with selected dynamic data; and FIG. 12b is a graph for the method of the present disclosure, ES with multiple Kalman gains and selected dynamic data.

MODE FOR INVENTION

Hereinafter, exemplary embodiments of the present disclosure will be described in detail with reference to the accompanying drawings.

Figure 1:
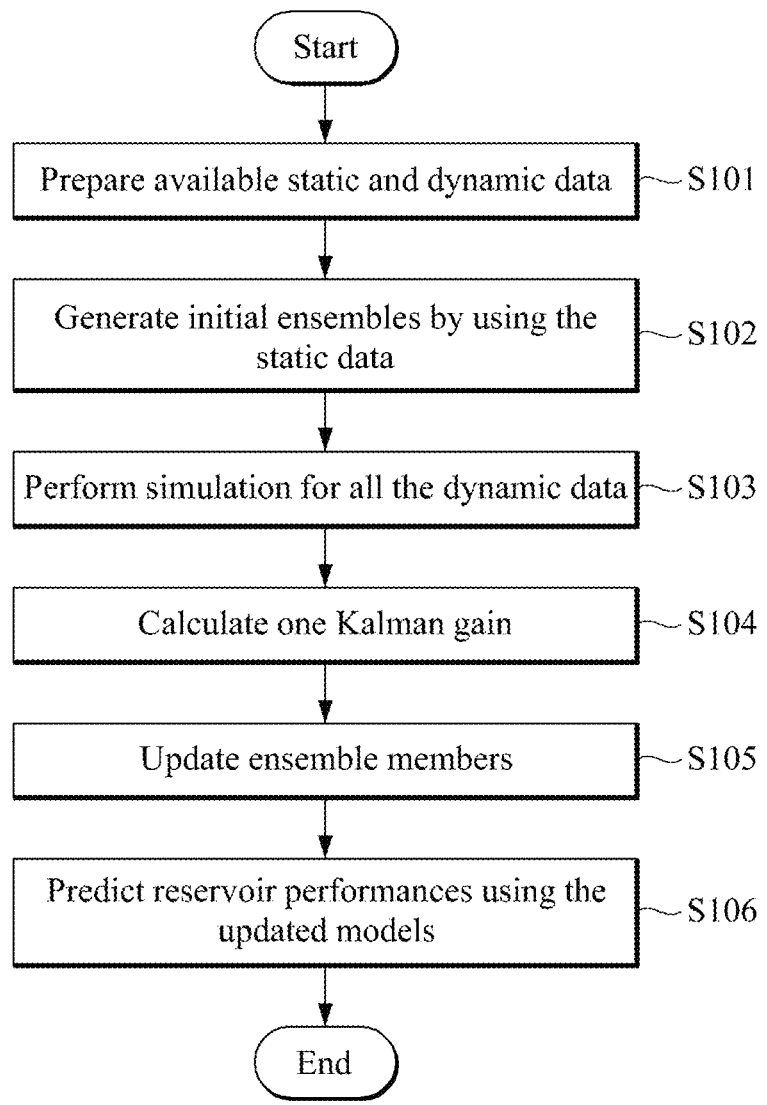
FIG. 1 is a flow chart illustrating a process for prediction of reservoir characterization by using the standard ES.
Figure 2:
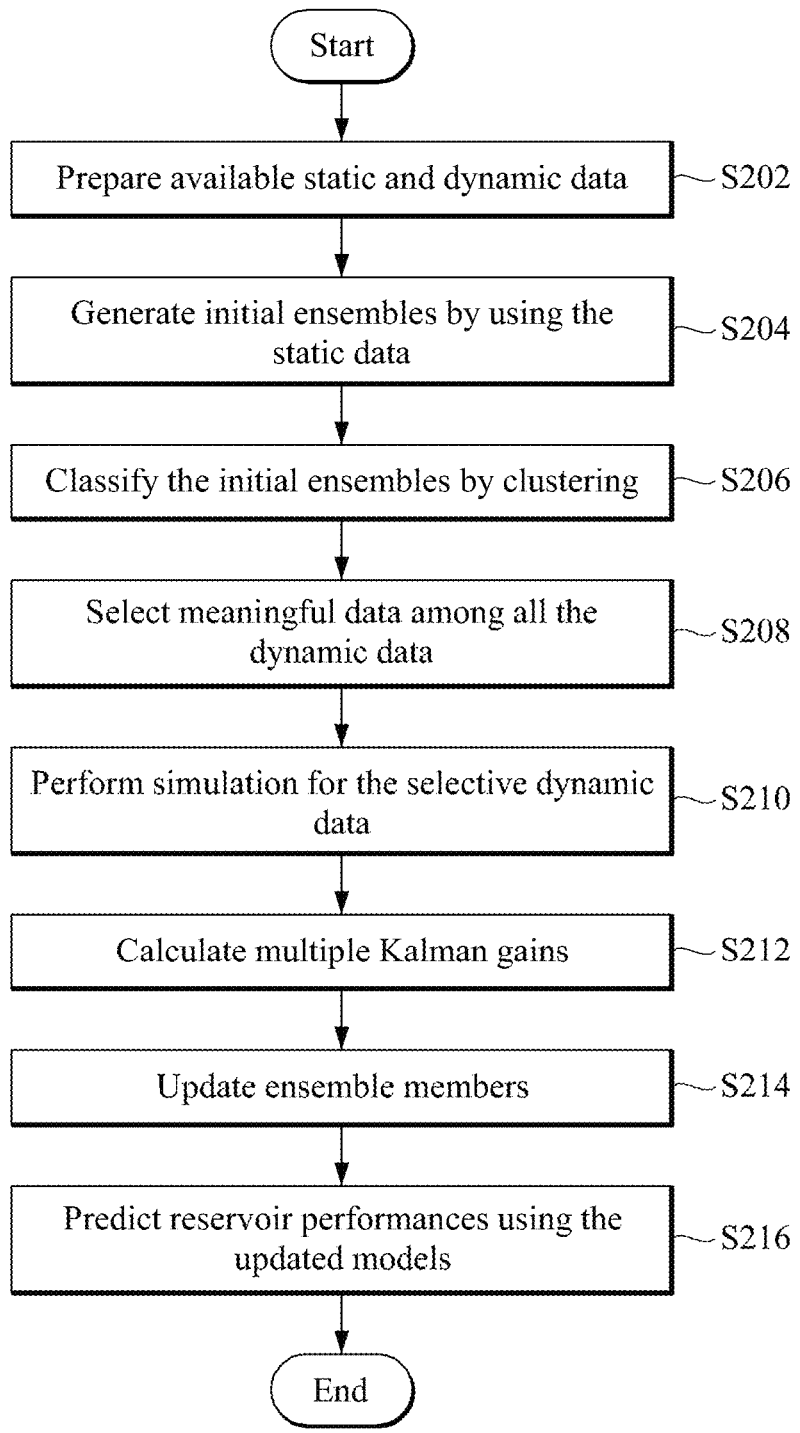
FIG. 2 is a flow chart illustrating a process for the ES with multiple Kalman gains and dynamic data selection according to an embodiment of the present disclosure.

FIG. 2 is a flow chart illustrating a process for the ES with multiple Kalman gains and dynamic data selection according to an embodiment of the present disclosure.

In step S202, available data are prepared. The available data include static and dynamic data.

In step S204, initial ensembles are generated by using the static data.

In step S206, the initial ensembles are classified by clustering based on a distance-based method, wherein the initial ensembles are generated in step S204. The initial ensembles similar to each other are bound into a same group through this.

In step S208, meaningful data are selected among the dynamic data prepared in step S202.

In step S210, dynamic simulation for the dynamic data selected in step S208 is performed by using the initial ensembles generated in step S204.

In step S212, multiple Kalman gains along with selected dynamic data in step S208 are calculated by using the initial ensembles bound into the same group in step S206.

In step S214, ensemble members are updated with selected dynamic data in step S208 and multiple Kalman gains in step S212.

In step S216, reservoir performances are predicted or uncertainty is quantified using the updated ensemble members.

The steps for calculating multiple Kalman gains and updating a static model by using dynamic data will be described more in detail with reference to the following drawings.

Figure 3A:
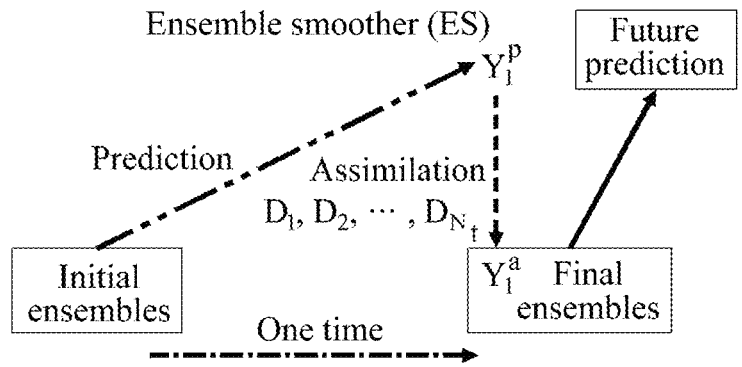
Figure 3B:
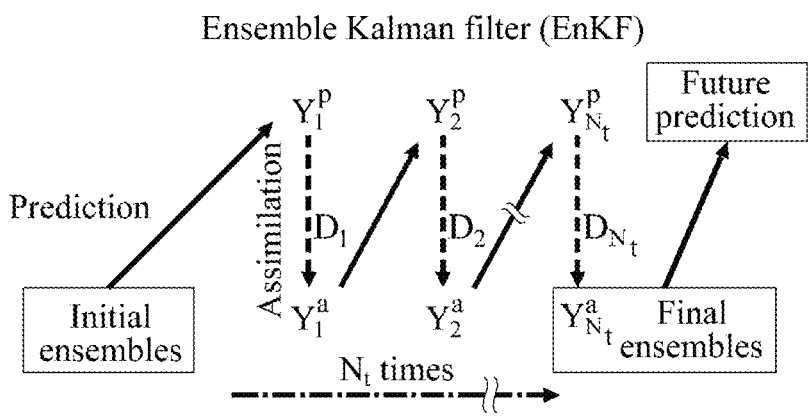

FIGS. 3a and 3b are diagrams illustrating the workflow of the ES and EnKF, respectively, with observed dynamic data (FIG. 3c) according to an embodiment of the present disclosure, wherein FIG. 3a is the ES; FIG. 3b is the EnKF; and FIG. 3c is the observed dynamic data.

Figure 3C:
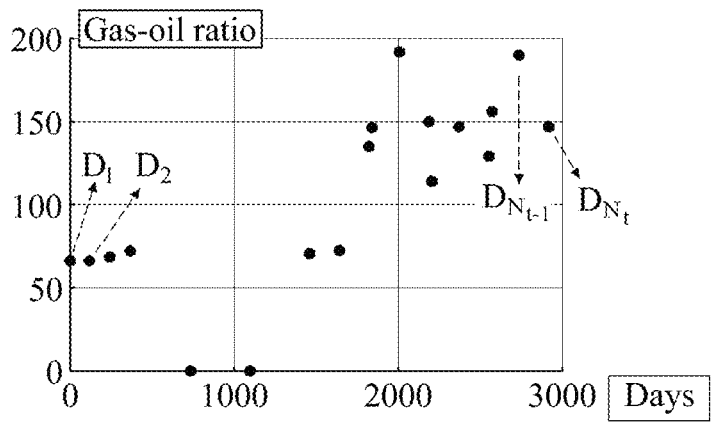
FIG. 3c is the observed dynamic data.

Referring to FIGS. 3a, 3b, and 3c, the ES assimilates all available dynamic data at a time regardless of observed time, which is called a global update (FIG. 3a). Accordingly, only one forecast step is required from an initial time, $t_i$, to a last observed time, $t_j$, as shown in equation 1.

$$y_{t_j,k,g} = \begin{bmatrix} m_{t_i}^s \\ m_{t_i}^d \\ d \end{bmatrix}_{k,g} \quad \text{[Equation 2]}$$

where, $m_{t_i}^d$ and $m_{t_j}^d$ represent dynamic variables at the initial time, $t_i$, and last time, $t_j$, respectively, $m_{t_i}^s$ represents a static variable at the initial time, $t_i$, and d represents dynamic data prediction from initial model to be compared with observed dynamic data. In the case of the EnKF, a recursive update is used, and each model is simulated until the next observed time instead of the last observed time (FIG. 3b). Other equations and assumptions except the update concept for assimilation are the same with those of the ES.

After the forecast step, each ensemble is expressed in the state vector as equation 2 to perform assimilation.

$$\begin{Bmatrix} m_{t_j}^d \\ d \end{Bmatrix} = f(m_{t_i}^s, m_{t_i}^d). \quad \text{[Equation 1]}$$

where, g, ranging from 1 to the number of total clusters ($N_c$), represents the group the model belongs to, k represents the models, which belong to the group g ranging from 1 to the number of total models in the group g ($N_g$), and $y_{ti,k,g}'$ represents the state vector of k-th model in the group g at initial time, $t_i$. As shown in equation 2, the state vector of the k-th ensemble member that belongs to the group g is composed of three elements $(m_{ti}^x, m_{ti}^d, d)'$.

In addition, the Kalman gain that minimizes the estimate error covariance is calculated as equation 3.

$$K_g = C_{Y,g}^{P} H^T (H C_{Y,g}^{P} H^T + C_D)^{-1} \quad \text{[Equation 3]}$$

where, $K_g$ indicates the Kalman gain representing the group g among multiple Kalman gains, $C_{Y,g}^{P-}$ indicates the previous estimate error covariance of the group g, H and $C_D$ represent the measurement operator matrix and observation error covariance, respectively, and $H^T$ means a transpose of the measurement operator matrix.

The Kalman gain has a similar role with the sensitivity matrix in gradient-based optimization methods as shown in equation 4.

$$m_i^u = m_i^{uc} + C_M G^T (G C_M G^T + C_D)^{-1} (d_i - g(m_i^{uc})) \quad \text{[Equation 4]}$$

where $m_i^u$ and $m_i^{uc}$ represent the assimilated and previous i-th model vectors, respectively, $C_M$ means the covariance matrix of the static parameters, and G means the sensitivity matrix.

As the sensitivity matrix has different values depending on model parameters, the Kalman gain should be also calculated depending on the models as well. However, previous researches on the ensemble-based method used a unified single Kalman gain for all ensemble members.

In the present disclosure, the Kalman gain for a corresponding group, $K_g$, is calculated by clustering similar ensembles as shown in equation 3 above. Equation 5 below is exactly same with one of the standard ES except multiple Kalman gains.

It is used for equation 5 to assimilate the state vector $y_{ti,k,g}$ in equation 2 above.

$$y_{k,g}^a = y_{k,g}^p + K_g (d_{k,g} - H y_{k,g}^p) \quad \text{[Equation 5]}$$

where, superscripts a and p indicate an assimilated and a previous states, respectively, $y_{k,g}^a$ and $y_{k,g}^p$ mean an assimilated and a previous state vectors of the k-th model in the group g, respectively, and $d_{k,g}$ represents the dynamic data prediction of the k-th model in the group g.

In the ensemble-based method, it is assumed that the mean of ensembles is true value and the static parameters follow Gaussian distribution. Therefore, the ensemble-based method is difficult to apply to improper initial ensemble models due to lack of geological information and to non-Gaussian fields such as channelized reservoirs.

The proposed method in the present disclosure improves the assimilated results by using multiple Kalman gains and selected dynamic data in equation 5. The concept of selected measurement data is also used in equation 3 above for the calculation of multiple Kalman gains. Since selective use of measurement data is a simple and intuitive concept, it can be one of solutions for reliable history matching. The ensemble-based method can assimilate various types of dynamic data such as pressure, production, and injection data. However, some data are not sensitive for model parameters and give confusing information for assimilation. Therefore, only meaningful production data are selected logically instead of all the available dynamic data.

These two concepts (multiple Kalman gains and selected dynamic data) are coupled with the standard ES and it is verified for PUNQ-S3 model.

Figure 4:
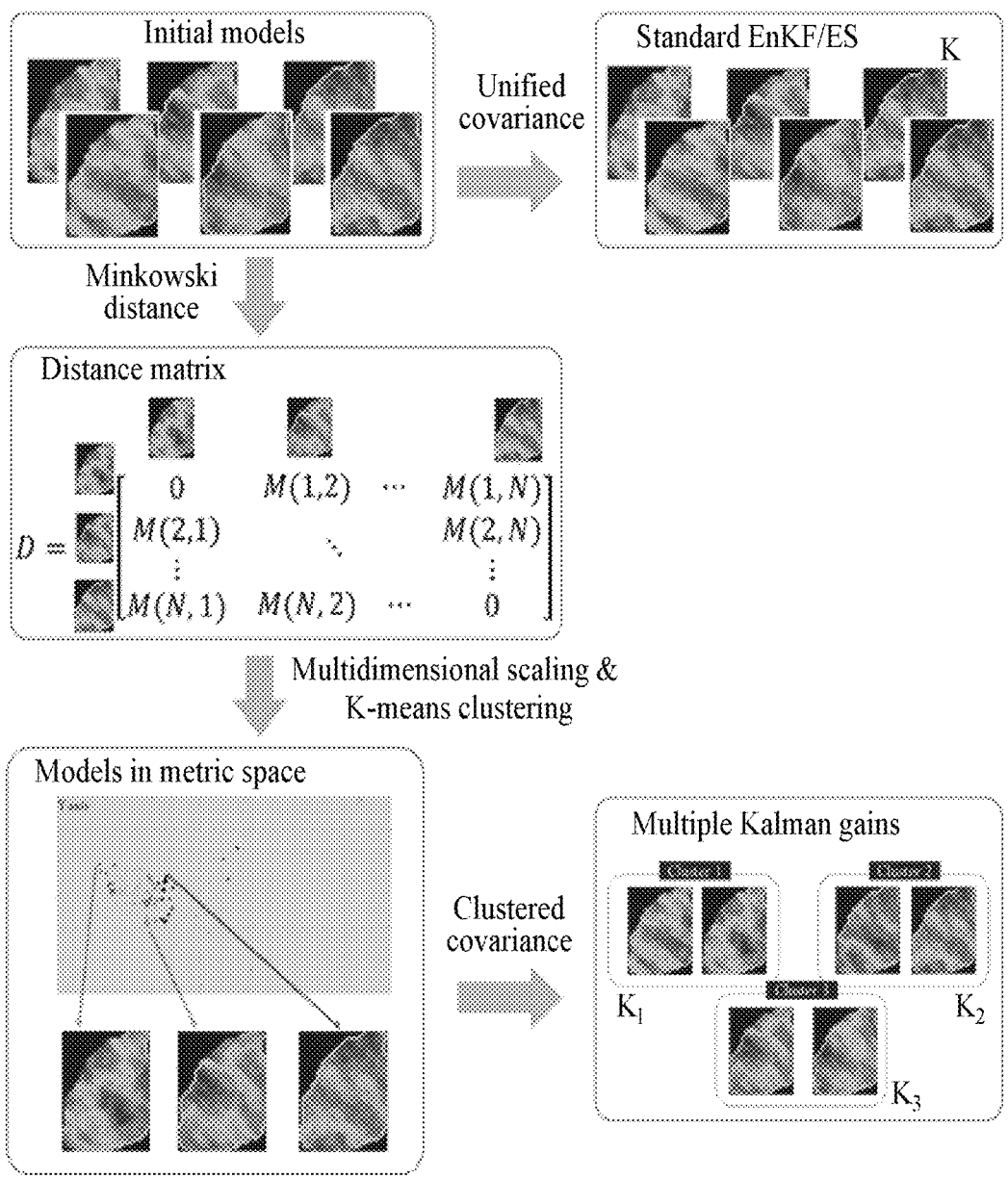
FIG. 4 is a diagram illustrating a procedure of clustering static models and obtaining the Kalman gain for each group (the concept of multiple Kalman gains) according to an embodiment of the present disclosure.

FIG. 4 is a diagram illustrating a procedure of clustering static models and obtaining the Kalman gain for each group (the concept of multiple Kalman gains) according to an embodiment of the present disclosure.

Referring to FIG. 4, the Kalman gain for each cluster can be calculated by clustering initial models with the distance-based method. After initial models are generated by integration of static data, a distance-based method is utilized to classify the initial models based on dissimilarity. The process for obtaining clustered covariance typically follows three steps: defining a distance, converting the models into the metric space using the defined distance, and clustering algorithm for grouping the models. At first, a Minkowski equation is utilized to obtain the distance matrix, which is defined as dissimilarity between two realizations, as shown in equation 6.

$$d_{ab} = \sqrt[p]{\sum_{i=1}^{N} |x_{ai} - x_{bi}|^p} \quad \text{[Equation 6]}$$

where, $d_{ab}$ represents the distance between models a and b, x represents a parameter compared for the distance calculation for each model and can be anything as long as it is related to a characterization of each model, $x_{ai}$ and $x_{bi}$ represent the values of i-th x parameter of the initial models a and b, respectively, and $|x_{ai} - x_{bi}|^p$ represents the absolute distance (positive value) between the models a and b with respect to the x parameter.

As described above, some researchers defined the x, which is a parameter for comparison of models, by using static data such as rock facies or permeability. Others employed dynamic data such as OPR or water breakthrough time for x. Although all of them successfully distinguished reservoir models, distance calculation from dynamic data requires additional simulation time. Clustering time can be reduced with the dissimilarity calculation defined by using static data according to a present embodiment.

Then, the distance matrix is converted into coordinates in n-dimensional (n-D) metric space by MDS, which is one of popular dimensional reduction methods. It depicts the models in the metric space while maximally conserving the original distance among models. The points in the metric space in FIG. 4 stand for each reservoir model and the more different the models are, the more increased the distances in the metric system are.

Finally, K-mean algorithm is applied to classify neighbor points into the same group. This classification consists of two steps of: selecting centroids and allocating the points to the closest centroid. The result of clustering is sensitive for location of the first set of centroids and the number of cluster. Silhouette index and sensitivity analysis are usable algorithms for the determination of the number of clusters.

Figure 5:
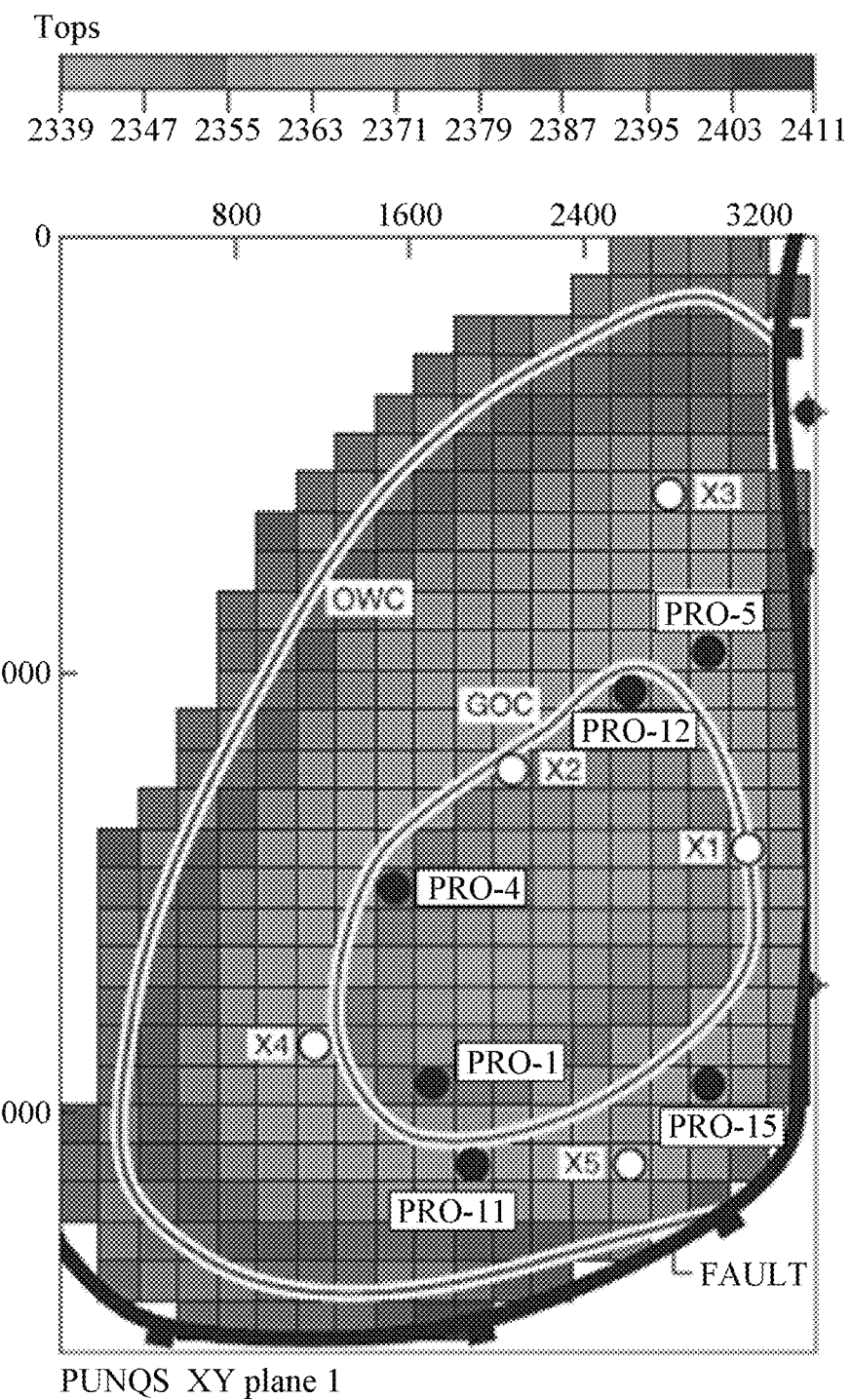
FIG. 5 is a diagram of top structure of production wells illustrating PUNQ-S3 model expressed on the X-Y plane according to an embodiment of the present disclosure.

FIG. 5 is a diagram of top structure of production wells illustrating PUNQ-S3 model expressed on the X-Y plane according to an embodiment of the present disclosure.

Referring to FIG. 5, the proposed method of the present disclosure, the ES with multiple Kalman gains and selective dynamic data, is applied to a widely known benchmark problem, PUNQ-S3 model, to confirm the effect thereof.

The grid of the PUNQ-S3 model consists of 19×28×5 with $\Delta x = \Delta y = 180$ m and is based on the corner-point system as illustrated in FIG. 5. In addition, it is also surrounded by a fault expressed in thick black line on the southeast part and bounded by an aquifer expressed in thick line on the northwest, which affects the number of active grids in each layer. The numbers of active grids are 396 on the first and second layers and 323 on the other layers, respectively. In FIG. 5, there are six production wells which have static data and four kinds of dynamic data: well OPR (WOPR), well bottom-hole pressure (WBHP), well gas-oil ratio (WGOR), and well WCT (WWCT).

In the experiment of the present disclosure, the total simulation period for the PUNQ-S3 model is 16.5 years, which is separated into the first 8 years of assimilation and the following 8.5 years of prediction, wherein current point is eighth year. During the first 8 years, well tests were carried out during the first year and then wells were shut-in for 3 years, and for the next 4 years, production was achieved. ECLIPSE 100 of Schlumberger is used for dynamic reservoir simulation.

Figure 6A:
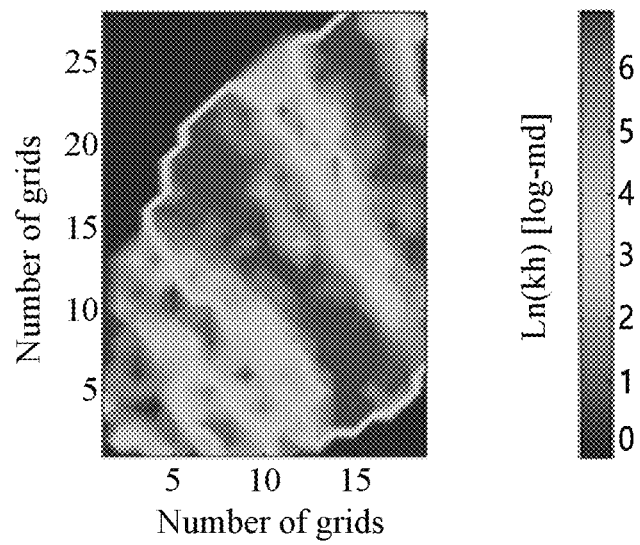
Figure 6B:
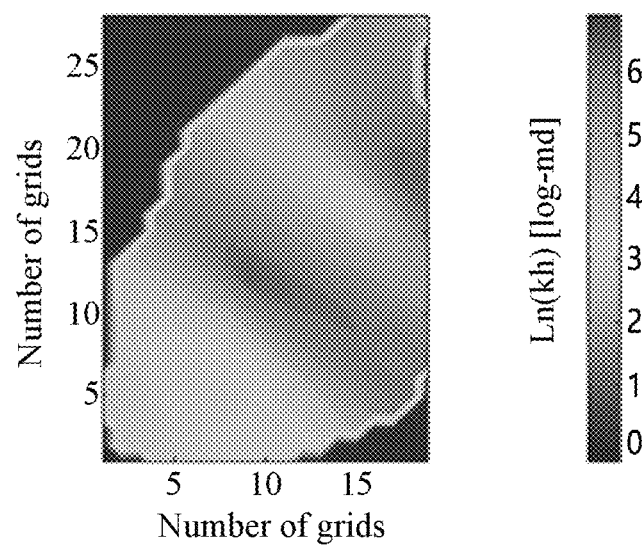
Figure 6C:
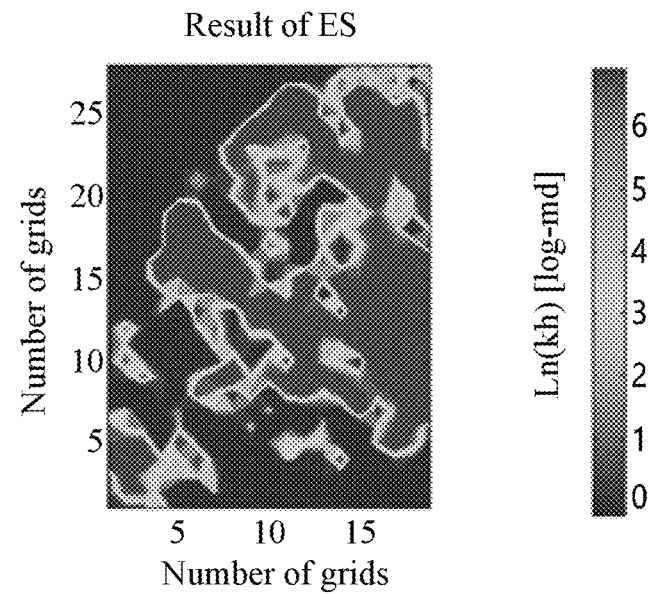
Figure 6D:
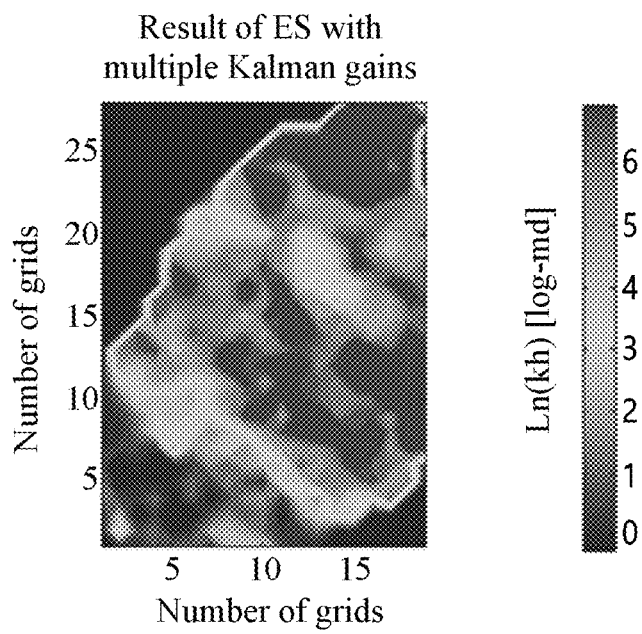

FIGS. 6a, 6b, 6c, and 6d are diagrams illustrating horizontal permeability (static model) according to an embodiment of the present disclosure, wherein FIG. 6a illustrates the reference field regarded as a right answer; FIG. 6b illustrates an average of the initial models; FIG. 6c illustrates an average of results of the standard ES; and FIG. 6d illustrates an average of results of the ES with multiple Kalman gains.

Referring to FIGS. 6a, 6b, 6c, and 6d, FIG. 6a is the reference field according to an embodiment of the present disclosure as the horizontal permeability in the first layer of the PUNQ-S3 model; FIG. 6b is the average of 100 initial ensemble models generated with geostatistical method from the static data of the six production wells of FIG. 5; FIG. 6c shows the result of the standard ES; and FIG. 6d shows the result of the ES with multiple Kalman gains. Meanwhile, the porosities for all layers are generated by sequential Gaussian simulation (SGS) from static geological information available, then initial horizontal permeability models are estimated with the porosity models by co-SGS. The correlation coefficient for porosity and horizontal permeability used in the present disclosure is 0.83, while geostatistics are implemented by SGeMS (Stanford geostatistical modeling software).

Prior to applying the proposed method of the present disclosure, the effect of multiple Kalman gains was investigated first. Here, only horizontal permeability from the first layer is used for model parameter as shown in FIG. 6a. The distance for clustering is defined by WGOR at "PRO-12" well which has a wide response range for initial ensembles.

Figure 7:
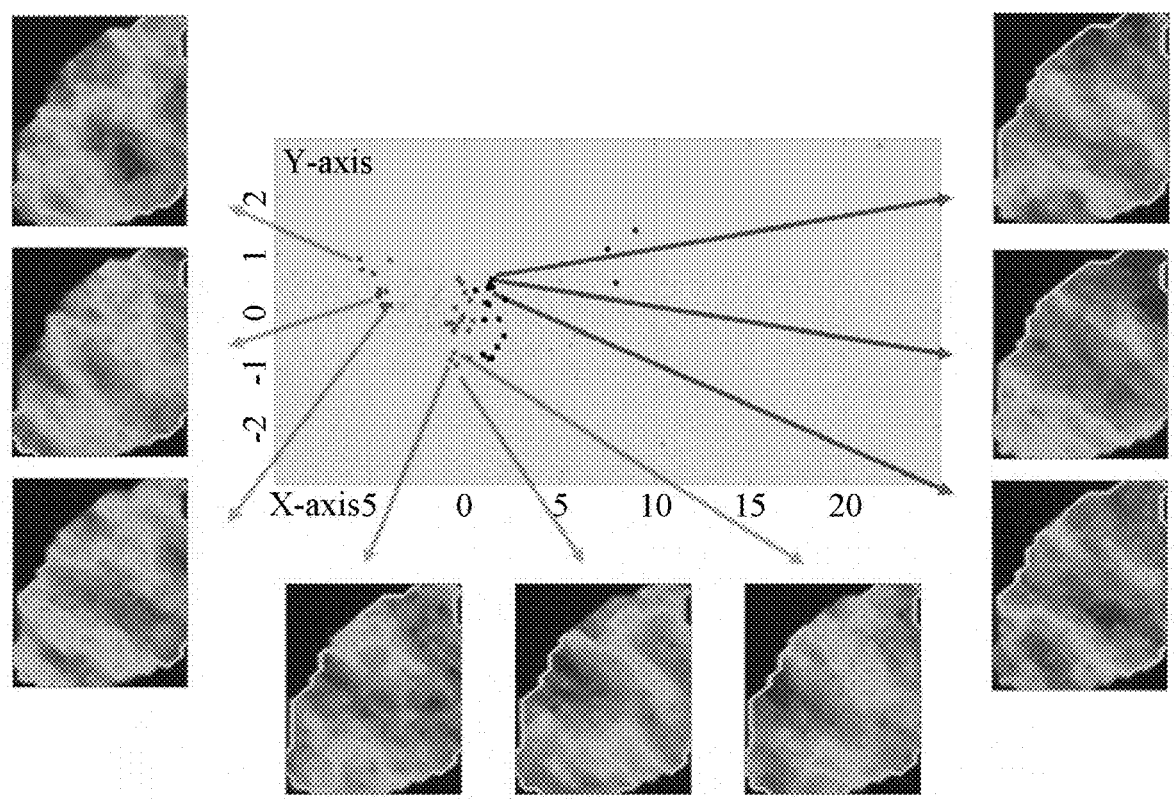
FIG. 7 is a diagram illustrating the similarity of the three static models in the same cluster for three clusters as a result of the distance-based clustering according to an embodiment of the present disclosure.

FIG. 7 is a diagram illustrating the similarity of the three static models in the same cluster for three clusters as a result of the distance-based clustering according to an embodiment of the present disclosure. Referring to FIG. 7, each point in FIG. 7 represents one of initial models and initial models in the same cluster have similar distribution of static parameters. Multiple Kalman gains are calculated by using the result of clustering and are used in assimilation. The updated models with the standard ES from 100 initial ensembles show an obvious overshooting problem as illustrated in FIG. 6c. However, as illustrated in FIG. 6d, the ES with multiple Kalman gains mitigates such the problem and conserves the major pattern of the reference field without the concept of selective use of dynamic data.

Figure 8A:
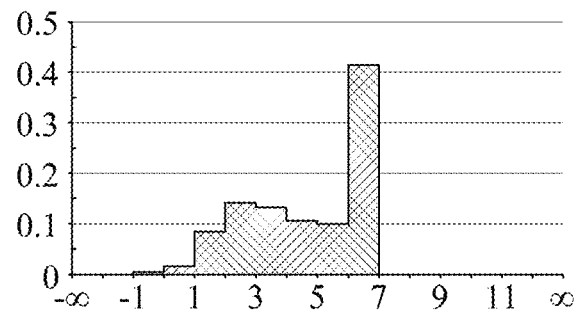
Figure 8B:
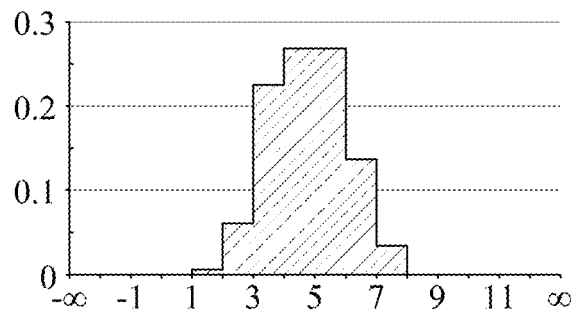
Figure 8C:
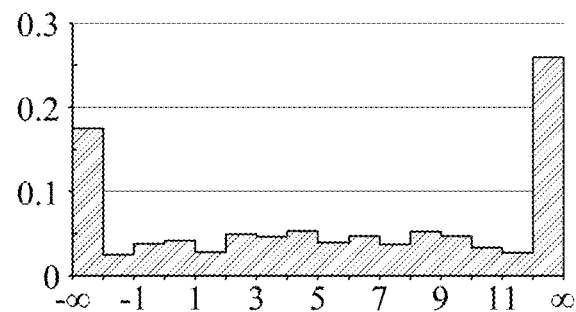
Figure 8D:
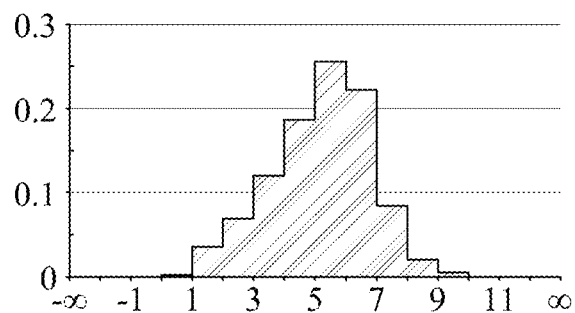

FIGS. 8a, 8b, 8c, and 8d illustrate the histograms of horizontal permeability from the first layer of the PUNQ-S3 model according to an embodiment of the present disclosure, wherein FIG. 8a is a graph of the reference field; FIG. 8b is a graph of the initial model; FIG. 8c is a graph of the standard ES; and FIG. 8d is a graph of the ES with multiple Kalman gains.

As illustrated in FIG. 8a, the histogram of the reference field has a highly negatively skewed distribution. In FIG. 8b, the histogram of the initial ensemble model has normal distribution due to the SGS algorithm. In FIG. 8c, the histogram of the standard ES shows the obvious overshooting problem and maximum and minimum values about 36.5 and −17.3 for the logarithm of permeability, respectively, which are unrealistic values for permeability. As a result, the standard ES is unable to give a reliable reservoir characterization for the PUNQ-S3. However, the histogram of the ES with multiple Kalman gains in FIG. 8d solves the overshooting problem and has a relative frequency nearby 7 log-millidarcy (log-mD). Consequently, this shows that the ES with multiple Kalman gains has an effect of improving the ES for assimilation.

Figure 9A:
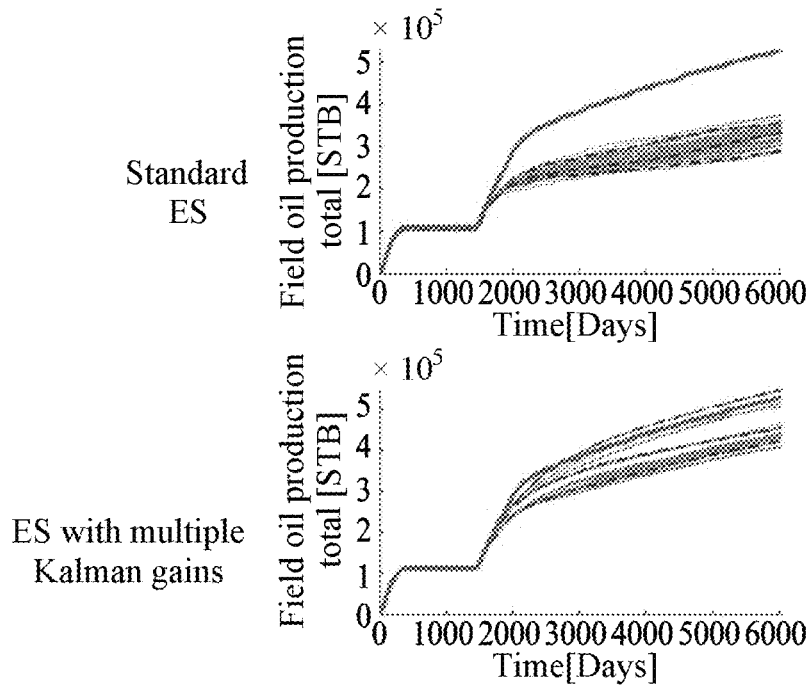
Figure 9B:
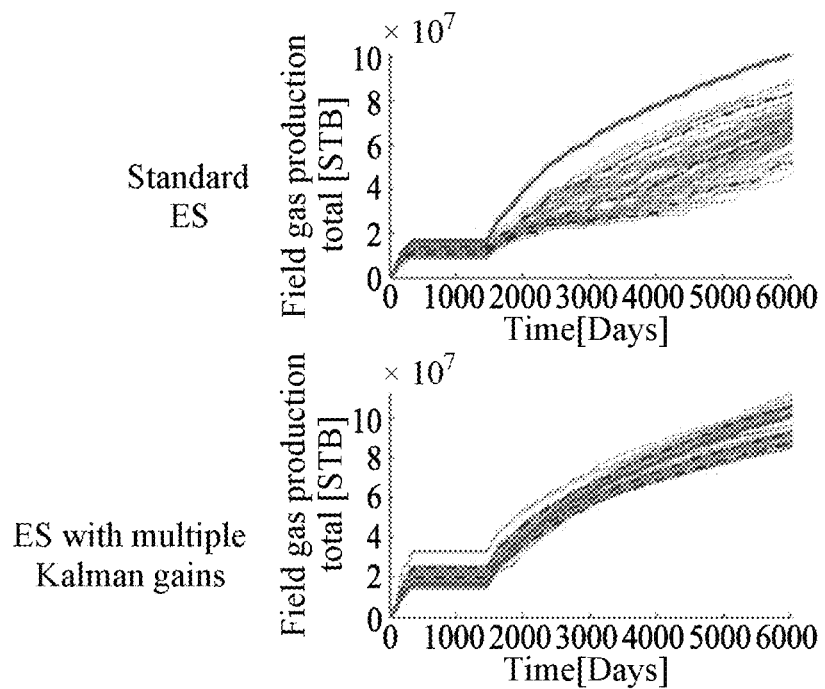
Figure 9C:
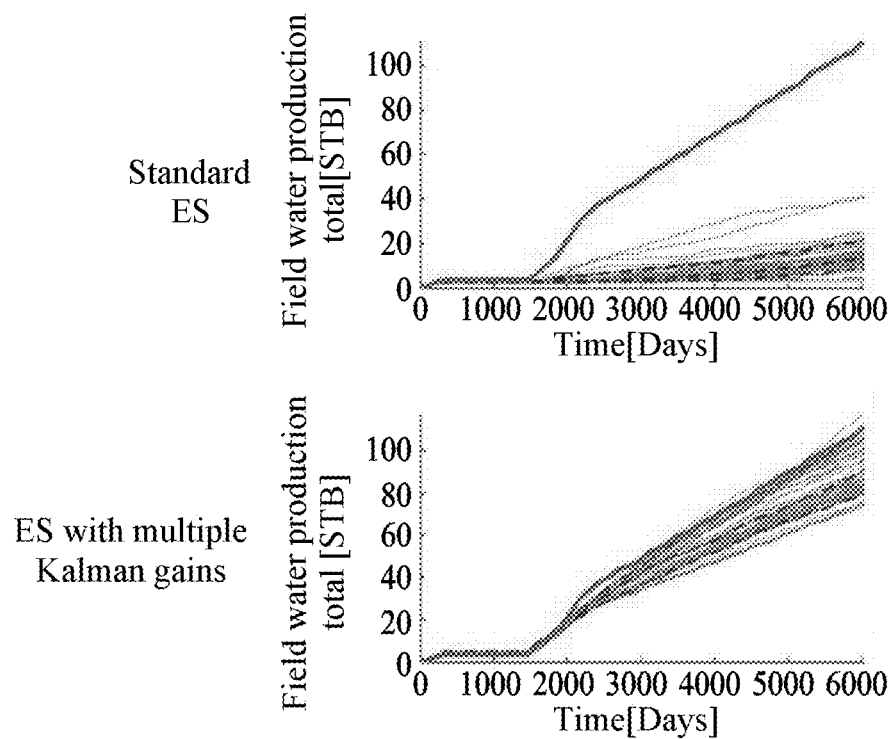

FIGS. 9a, 9b, and 9c illustrate prediction of each reservoir performance from the updated models of the standard ES (the first row) and the ES with multiple Kalman gains (the second row) according to an embodiment of the present disclosure, wherein FIG. 9a is a graph illustrating COP; FIG. 9b is a graph illustrating CGP; and FIG. 9C is a graph illustrating CWP.

Referring to FIGS. 9a, 9b, and 9c, the thin solid lines represent the result of each updated model and the thick solid line stands for the reference field's production. The dot lines from the top are P10, P50, and P90 of the thin solid lines, respectively.

Since the ES is assimilated with wrong models, as is confirmed in FIGS. 6c and 8c, the results from the standard ES show unreliable future reservoir performances accordingly, as illustrated in the first row of FIGS. 9a, 9b, and 9c. The thin solid lines for COP, CGP, and WWP are far off from the true values of thick solid line. However, the productions from the ES with multiple Kalman gains give much more improved and reliable ranges including true values (the second row of FIGS. 9a, 9b, and 9c). This is due to use of multiple Kalman gains based on the clustering instead of the inaccurate one Kalman gain.

Figure 10A:
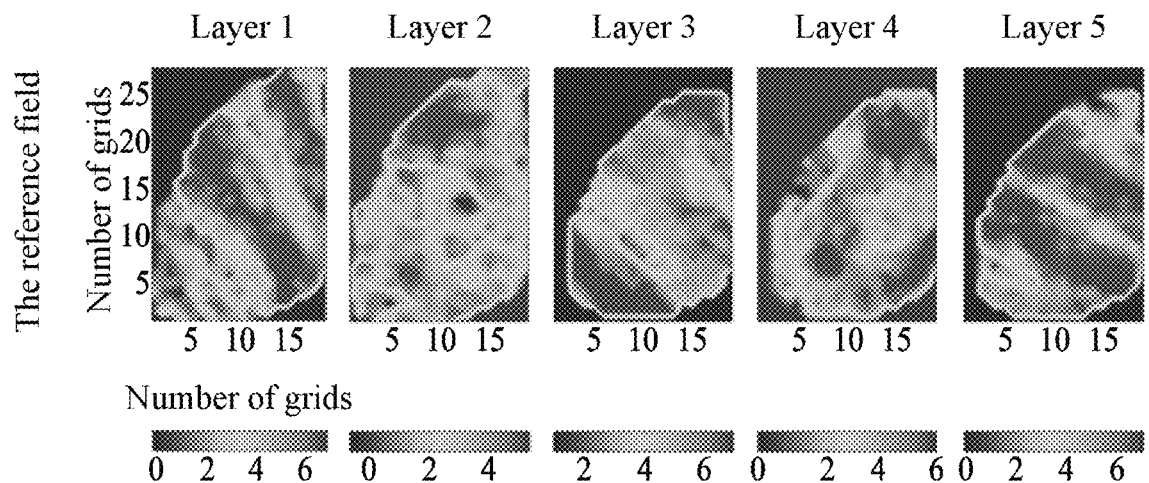
Figure 10B:
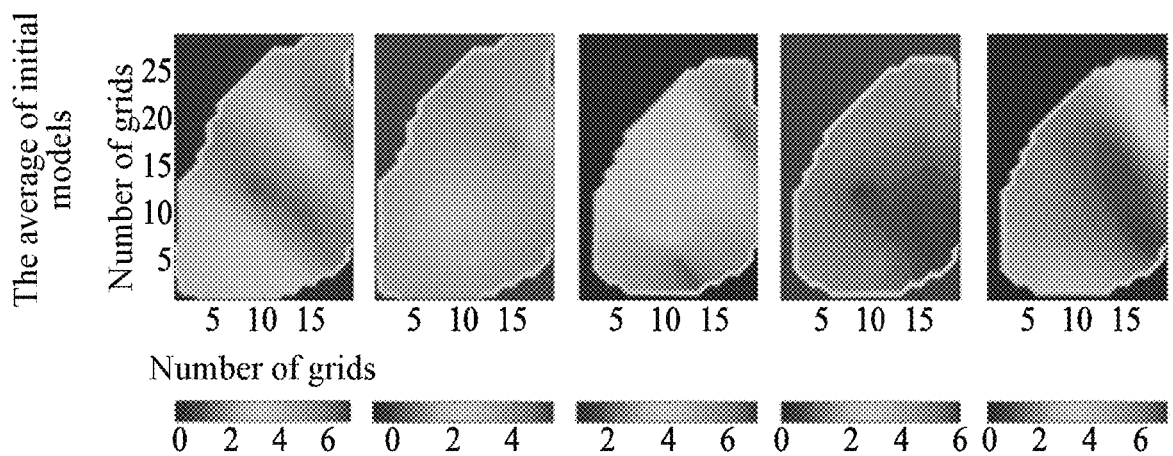
Figure 10C:
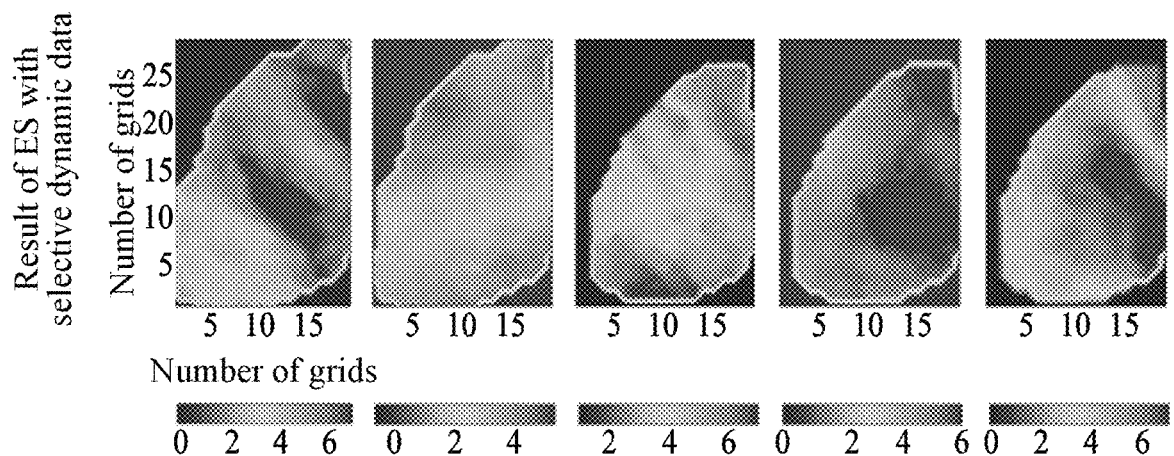
Figure 10D:
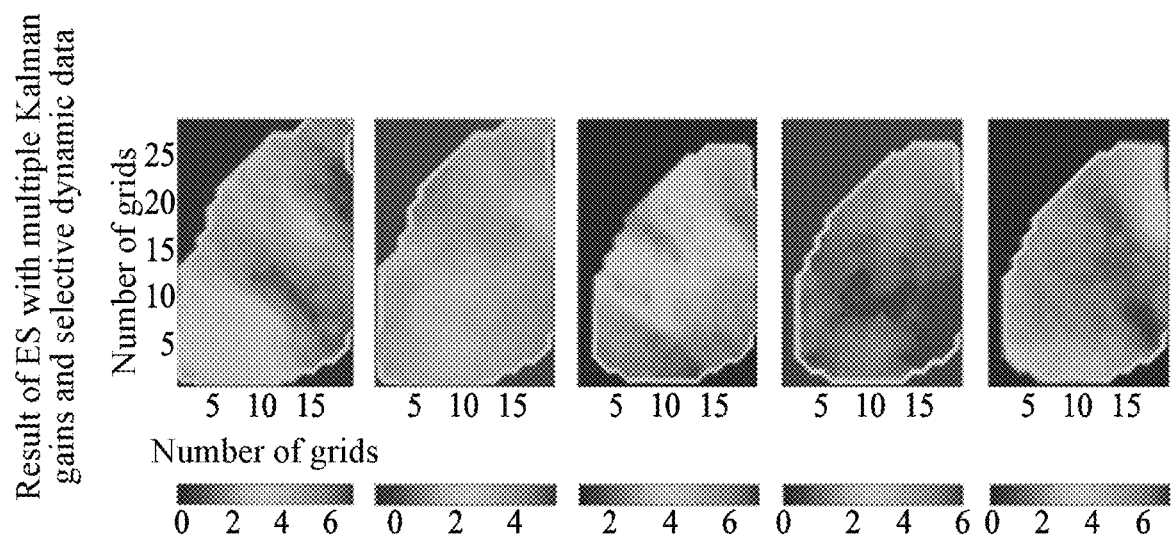

FIGS. 10a, 10b, 10c, and 10d illustrate horizontal permeability of all five layers of the PUNQ-S3 model according to an embodiment of the present disclosure, wherein FIG. 10a is a diagram illustrating the reference field; FIG. 10b is a diagram illustrating averages of initial models; FIG. 10c is a diagram illustrating averages of the ES with selected dynamic data; and FIG. 10d is a diagram illustrating averages of the ES with multiple Kalman gains and selected dynamic data.

The proposed method of the present disclosure, the ES with multiple Kalman gains and selected dynamic data, is applied to the 3D reference fields like FIG. 10a. For multiple Kalman gains, horizontal permeability, which is the static model parameter itself, is employed to the distance calculation. For selected dynamic data concept, Table 1 shows the selected dynamic data logically among all observed data and observation noises. For example, shut-in BHP data among WBHP are eliminated from the data for assimilation because they are very similar for each initial model. Otherwise, they may increase calculation time in assimilation by enlarging matrix size and decrease assimilation reliability by confused information.

TABLE 1

| Time (Days) | WBHP (number) | WGOR (number) | WWCT (number) |
|---|---|---|---|
| 274 | — | 6 | — |
| 1,642 | — | 6 | — |

TABLE 1-continued

| Time (Days) | WBHP (number) | WGOR (number) | WWCT (number) |
|---|---|---|---|
| 1,826 | 6 | 6 | — |
| 2,008 | — | — | 6 |
| 2,192 | 6 | 6 | 6 |
| 2,373 | — | — | 6 |
| 2,557 | 6 | 6 | 6 |
| 2,572 | — | — | 6 |
| 2,738 | — | — | 6 |
| 2,992 | 6 | 6 | 6 |
| Total | 24 | 36 | 42 |
| Observation noise | 3 bar | 10% for less than 90 m$^3$/m$^3$, 25% for more than 90 m$^3$/m$^3$ | 0.01 |

When the average of updated horizontal permeability for initial models is checked, no overshooting problem is found in cases of the ES with selective data and the proposed method (the ES with multiple Kalman gains and selective data) as shown in FIGS. 10c and 10d. In addition, the averages of updated models show proper specific patterns of the reference fields. The previous studies of a standard EnKF for the PUNQ-S3 or the studies of the standard ES above (see FIGS. 6c and 8c) showed overshooting problem, but the problem is resolved with selective use of the dynamic data for the ES. Thus, it is confirmed that selective use of the dynamic data for the ensemble-based method is important and effective.

Figure 11A:
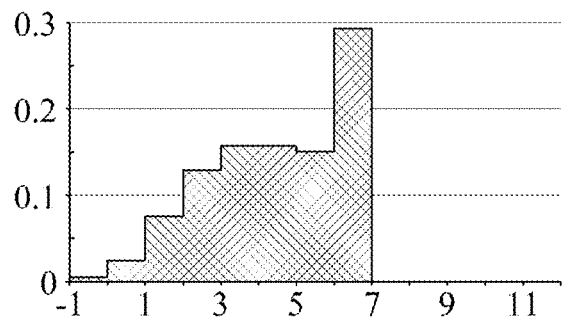
Figure 11B:
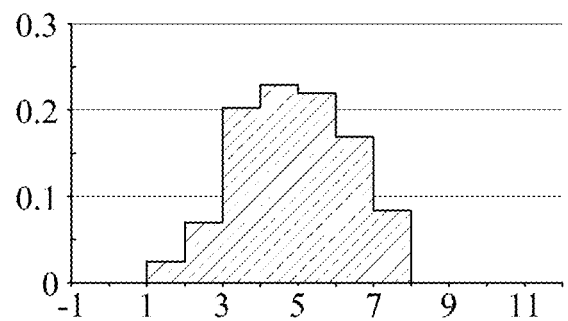
Figure 11C:
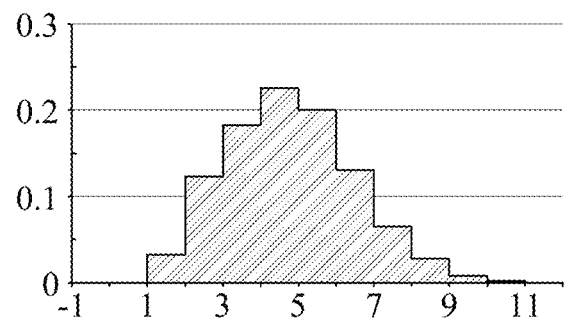
Figure 11D:
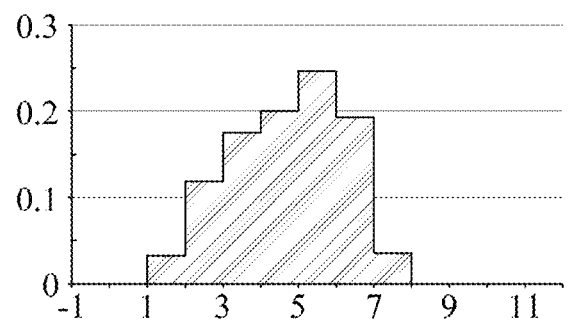

FIGS. 11a, 11b, 11c, and 11d illustrate the histograms of horizontal permeability of the PUNQ-S3 model according to an embodiment of the present disclosure, wherein FIG. 11a is a diagram of the reference field; FIG. 11b is a diagram of the initial model; FIG. 11c is a diagram of the ES with selected dynamic data; and FIG. 11d is a diagram of the ES with multiple Kalman gains and selected dynamic data.

The histogram of the reference field has a high relative frequency around 7 of log-mD as illustrated in FIG. 11a. In the case of the ES with selective dynamic data, overshooting values in the histogram of the standard ES as illustrated in FIG. 8c disappear as illustrated in FIG. 11c due to the effect of selective use of observed data. In addition, the histogram of the proposed method of the present disclosure, the ES with multiple Kalman gains and selected dynamic data, reveals no overshooting problem as shown in FIG. 11d. Furthermore, it describes properly the distribution of the reference field having a high relative frequency around 7 of log-mD.

Figure 12A:
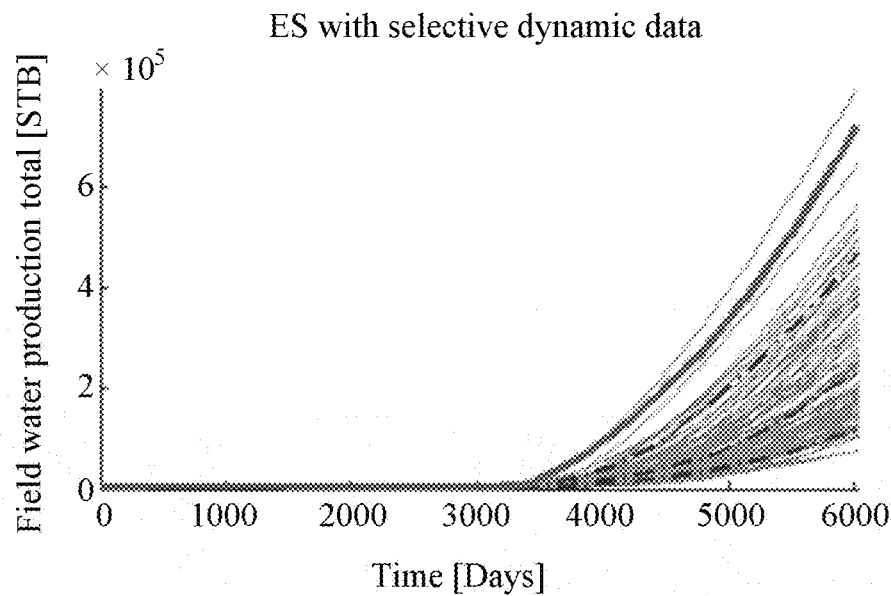
Figure 12B:
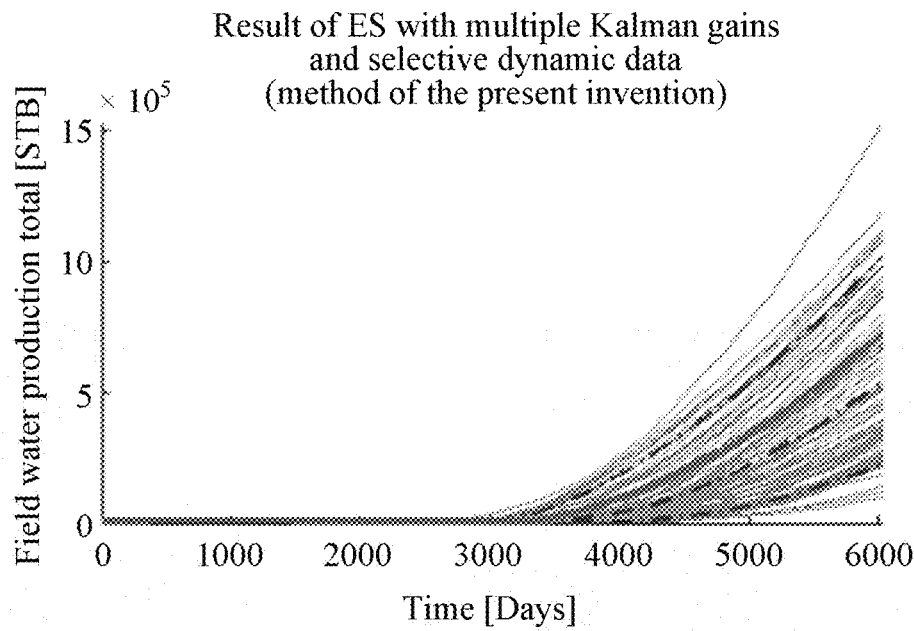

FIGS. 12a and 12b illustrate predictions of CWP from the updated models according to an embodiment of the present disclosure, wherein FIG. 12a is a graph for the ES with selected dynamic data; and FIG. 12b is a graph for the method of the present disclosure.

The result from the ES with selected data as illustrated in FIG. 12a gives better prediction than those from the standard ES as illustrated in first row of FIGS. 9a, 9b, and 9c. However, uncertainty thereof is so highly biased that the true value (thick solid line) is positioned out of the uncertainty range between P10 and P90 as illustrated in FIG. 12a. The results from the method of the present disclosure, the ES with multiple Kalman gains and selected dynamic data, show reliable uncertainty quantification that the actual production is positioned in the middle of uncertainty range. Consequently, reasonable decision making and development plan can be established through prediction of future production from the proposed method only.

Meanings according to an embodiment of the present disclosure are as follows. Firstly, the method of the present disclosure is tested to one of the most famous benchmark models, PUNQ-S3. The benchmark model is known to be difficult to characterize even for EnKF due to the overshooting problem. It is very hard to apply the ES for PUNQ-S3, since the ES, despite of the faster calculation speed thereof, is more vulnerable to the overshooting problem than the EnKF. Actually, the standard ES shows serious overshooting problem even in 2D case as can be seen in FIGS. 6c and 8c. However, the method of the present disclosure carried out successfully the characterization of PUNQ-S3 by using the two concepts of multiple Kalman gains and selected observed dynamic data.

Secondly, initial models are successfully grouped for 3D model. Initial models are classified by a Minkowski distance, MDS, and K-means clustering using a permeability value itself, or selected dynamic data. Reliable clustering is prerequisite for a proper calculation of multiple Kalman gains.

Thirdly, the ES with multiple Kalman gains without introducing selective dynamic data concept resolves the overshooting problem of the standard ES and conserves direction of high permeability in the reference field. The concept of multiple Kalman gains can increase reliability of assimilation because a proper Kalman gain can be coupled with each ensemble instead of only one Kalman gain.

Fourthly, selective use of the observed dynamic data mitigates the overshooting problem that the standard ES has. However, the ES with selective dynamic data has some limitation that the reliability of future production from the updated models is low.

Fifthly, the ES with multiple Kalman gains and selective dynamic data (the method of the present disclosure) resolved the problems arising from the standard ES or the ES with selective dynamic data concept only. Future production from the updated fields gives an appropriate uncertainty range including the true production. Thus, the present disclosure can expand the applicability of the ES for complex 3D benchmark model and can be utilized for reasonable decision making.

Sixthly, the method of the present disclosure as described above can be processed by a general computing apparatus, wherein the computing apparatus can be materialized by using any appropriate combination of at least one of processing circuit executing a software module stored in a memory such as a microprocessor, a digital signal processor (DSP), a microcontroller, a portable wireless phone, a personal digital assistant (PDA), and a paging device; or a firmware in which a software and/or an application stored in hardware and the memory is maintained. For example, the specifications of the computer used in the present research are 3.4 GHz CPU consisting of eight cores and 32 GB RAM consisting of four 8 GB memory modules. In addition, all calculations were done in MATLAB and ECLIPSE 100 is also implemented through MATLAB.

Seventhly, the method of the present disclosure not only improves the assimilation reliability but also reduces sharply time required for history matching. In comparison of time required for history matching, a total of 5,687 minutes are necessary for the case of the EnKF due to 45 iterative assimilations while a total of 128 minutes is necessary for the proposed ES according to the present disclosure since one assimilation is only required. Consequently, the proposed ES according to the present disclosure saves time by 97.7% compared with the EnKF. The preprocessing stage of the present disclosure needs only additional four minutes because distance-based clustering is not an inverse modeling algorithm. Therefore, the proposed method is almost similar with the standard ES in terms of simulation cost.

Although the content of the present disclosure above has been described with reference to embodiments shown in drawings for illustrative purposes, those skilled in the art will appreciate that various modifications and equivalent other embodiments are possible. Therefore, the real technical protection scope of the present disclosure should be defined by the technical idea as disclosed in the accompanying claims.

The invention claimed is:

1. An ensemble-based reservoir characterization method using multiple Kalman gains and dynamic data selection, the method comprising:
   preparing available data including static and dynamic data;
   generating initial ensembles by using the prepared static data;
   clustering and separating the generated initial ensembles on the basis of a distance-based method;
   selecting data among all the dynamic data;
   dynamically simulating the selected dynamic data by using the generated initial ensembles;
   calculating multiple Kalman gains by using initial models clustered in the same group as the selected dynamic data;
   updating ensemble members by means of the selected dynamic data and the multiple Kalman gains; and
   predicting a movement of a reservoir by using the updated ensemble members, and evaluating uncertainty thereof
   and wherein at the updating the ensemble members by using an ensemble smoother, the state vector v, representing the ensembles, is expressed by the following equation:

$$y_{t_i,k,g} = \begin{bmatrix} m_{t_i}^s \\ m_{t_i}^d \\ d \end{bmatrix}_{k,g}$$

where, g represents a group a model belongs to and is selected from 1 to the number of clusters ($N_c$), k represents the model in the group g and is selected from 1 to the total number of models ($N_g$) in the group g, thus yti,k,g represents a state vector of k-th model in the group g at an initial time ti, $m_{t_i}^a$ and $m_{t_i}^d$ represent static and dynamic parameters at the initial time, ti, respectively, and d represents dynamic data prediction; and the state vector is assimilated by using the multiple Kalman gains and the dynamic data selection by the following equation:

$$y_{k,g}^a = y_{k,g}^p + K_g(d_{k,g} - H y_{k,g}^p)$$

where, superscripts a and p indicate an assimilated and a previous states, respectively, $y_{k,g}^a$ and $y_{k,g}^p$ mean an assimilated and a previous state vectors of the k-th model in the group g, respectively, H represents a measurement operator matrix, and dk,g represents the dynamic data predication of the k-th model in the group g.

2. The method of claim 1, wherein at the calculating the multiple Kalman gains, the multiple Kalman gains are calculated by the following equation:

$$K_g = C_{Y,g}^p H^T (H C_{Y,g}^p H^T + C_D)^{-1}$$

where, $K_g$ indicates a Kalman gain representing the group g among the multiple Kalman gains, $C_{Y,g}^{p-}$ indicates a previous estimate error covariance of the group g, H represents a measurement operator matrix, and $C_D$ represents an observation error covariance, and $H^T$ means a transpose of the measurement operator matrix.

3. The method of claim 2, wherein calculating the multiple Kalman gains includes calculating the multiple Kalman gains by group, after clustering the initial ensembles.

4. The method of claim 3, wherein the distance-based method is obtained by:
   obtaining a distance matrix;
   converting the distance matrix into coordinate points in the metric space; and
   classifying adjacent coordinate points into the same group.

5. The method of claim 4, wherein the obtaining the distance matrix is performed by using a Minkowski equation, wherein definition of a distance is performed for the static data or the selected dynamic data;
   the converting the distance matrix into the coordinate points in the metric space is performed by using multidimensional scaling; and
   the classifying the adjacent coordinate points into the same group is performed by using K-means algorithm.

6. The method of claim 1, wherein the selected dynamic data uses logically meaningful dynamic data only among all the available dynamic data, wherein the meaningful dynamic data have unique values different from the dynamic data.

* * * * *